(12) United States Patent
Amin et al.

(10) Patent No.: US 11,356,017 B2
(45) Date of Patent: Jun. 7, 2022

(54) LI-ION-COMPATIBLE FULLY-INTEGRATED HYBRID CONVERTER

(71) Applicant: The Regents of the University of California, Oakland, CA (US)

(72) Inventors: Sally Amin, La Jolla, CA (US); Patrick Mercier, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 254 days.

(21) Appl. No.: 16/843,175

(22) Filed: Apr. 8, 2020

(65) Prior Publication Data

US 2020/0321860 A1   Oct. 8, 2020

Related U.S. Application Data

(60) Provisional application No. 62/830,661, filed on Apr. 8, 2019.

(51) Int. Cl.
| | |
|---|---|
| *H02M 3/07* | (2006.01) |
| *H03K 3/356* | (2006.01) |
| *H02J 7/00* | (2006.01) |
| *H01M 10/0525* | (2010.01) |

(52) U.S. Cl.
CPC .............. *H02M 3/073* (2013.01); *H02J 7/007* (2013.01); *H03K 3/356113* (2013.01); *H01M 10/0525* (2013.01); *H02J 2207/20* (2020.01)

(58) Field of Classification Search
CPC .......... H02M 3/07; H02M 3/073; H02M 3/00; H03K 3/356; H03K 3/356113; H02J 7/00; H02J 7/007; H02J 7/02; H02J 7/022; H02J 2207/20; H01M 10/0525
USPC ........................................................ 320/128
See application file for complete search history.

(56) References Cited

U.S. PATENT DOCUMENTS

| | | | |
|---|---|---|---|
| 2008/0197706 A1* | 8/2008 | Nielsen ................... | H02M 5/40 307/66 |
| 2017/0264205 A1* | 9/2017 | Chiang ............. | H02M 3/33553 |
| 2020/0212795 A1* | 7/2020 | Das ........................ | H02M 3/07 |
| 2020/0328675 A1* | 10/2020 | Seo ........................ | H02M 3/07 |

OTHER PUBLICATIONS

Bandyopadhyay et al., "20uA to 100mA DC-DC converter with 2.8-4.2 v battery supply for portable applications in 45 nm CMOS," IEEE Journal of Solid-State Circuits, vol. 46, No. 12, pp. 2807-2820, 2011.

(Continued)

*Primary Examiner* — Richard Isla
*Assistant Examiner* — Dung V Bui
(74) *Attorney, Agent, or Firm* — Greer, Burns & Crain, Ltd.; Steven P. Fallon

(57) ABSTRACT

A DC-DC converter converts voltage from a battery source providing a voltage $V_{in}$ to a lower level. A four-level transistor stack selectively connects an input voltage and flying capacitor voltages to an output inductor. Stress reduction transistors limit the charging of the flying capacitors to $V_{in}/3$. The stress reduction transistors can also limit switching transistor voltages to $V_{in}/3$. Freewheel switches can be used to limit ringing in the output inductor.

20 Claims, 9 Drawing Sheets

(56) References Cited

OTHER PUBLICATIONS

Y. K. Ramadass, A. A. Fayed and A. P. Chandrakasan, "A Fully-Integrated Switched-Capacitor Step-Down DC-DC Converter With Digital Capacitance Modulation in 45 nm CMOS," JSSC, 2010.

R. .Jain, et al., "A 0.45-1 V Fully-Integrated Distributed Switched-Capacitor DC-DC Converter With High-Density MIM Capacitor in 22 nm Tri-Gate CMOS," IEEE J. Solid-State Circuits, vol. 49, No. 4, pp. 917-927, 2014.

T. Breussegem and M. Steyaert, "Monolithic capacitive DC-DC converter with single boundary Multiphase control and voltage domain stacking in 90 nm CMOS," IEEE Journal of Solid-State Circuits, vol. 46, No. 7, pp. 1715-1727, 2011.

H. Le et al., "A sub-ns response fully integrated battery-connected switched-capacitor voltage regulator delivering 0.19 \$W/mm^\$ at 73\% efficiency," IEEE International Solid-State Circuits Conference, 2013.

S. Bang et al., "A Successive-Approximation Switched-Capacitor DC-DC Converter With Resolution of $V_{IN}/2^{N}$ for a Wide Range of Input and Output Voltages," {\em IEEE Journal of Solid-State Circuits}, vol. 51, No. 2, pp. 543-556, 2016.

P. Kumar et al., "A 0.4V\$\sim\$1V 0.2A/$mm^2$ 70\% efficient 500MHz fully integrated digitally controlled 3-level buck voltage regulator with on-die high-density MIM capacitor in 22nm tri-gate CMOS," {\em IEEE Custom Integrated Circuits Conference (CICC)}, 2015.

H. Krishnamurthy et al., "A 500 MHz, 68\% efficient, fully on-die digitally controlled buck Voltage Regulator on 22nm Tri-Gate CMOS," {\em IEEE Symposium on VLSI Circuits}, 2014.

J. Wibben and R. Harjani, "A High-Efficiency DC-DC Converter Using 2 nH Integrated Inductors," {\em IEEE Journal of Solid-State Circuits}, vol. 43, No. 4, pp. 844-854, Apr. 2008. % coupled inductor.

M. Lee et al., "A 500-MHz, 0.76-W/mm Power Density and 76.2\% Power Efficiency, Fully Integrated Digital Buck Converter in 65-nm CMOS," {\em IEEE Transactions on Industry Applications}, vol. 52, No. 4, pp. 3315-3323, 2016.

C. Huang and P. K. T. Mok, "An 82.4\% efficiency package-bondwire based four-phase fully integrated buck converter with flying capacitor for area reduction," in Proc. IEEE Int. Solid-State Circuits Conf.(ISSCC'13), Feb. 2013, pp. 362-363. % 4-phase.

Monodeep Kar, Arvind Singh, Anand Rajan, Vivek De, Saibal Mukhopadhyay, "An All-Digital Fully Integrated Inductive Buck Regulator With A 250-MHz Multi-Sampled Compensator and a Lightweight Auto-Tuner in 130-nm CMOS", JSSC, 2017.

Y. Ahn, H. Nam and J. Roh, "A 50-MHz Fully Integrated Low-Swing Buck Converter Using Packaging Inductors," in IEEE Transactions on Power Electronics, vol. 27, No. 10, pp. 4347-4356, Oct. 2012.

G. Villar and E. Alarcón, "Monolithic integration of a 3-level DCM operated low-floating-capacitor buck converter for DC-DC step-down conversion in standard CMOS," in IEEE Power Electronics Specialist Conf. (PESC), 2008.

W. Godycki, B. Sun and A. Apsel, "Part-time resonant switching for light load efficiency improvement of a 3-level fully integrated buck converter," ESSCIRC 2014—40th European Solid State Circuits Conference (ESSCIRC), Venice Lido, 2014, pp. 163-166.

W. Kim et al., "A fully-integrated 3-Level DC-DC converter for nanosecond-scale DVFS," IEEE Journal of Solid-State Circuits, vol. 47, No. 1, pp. 206-219, 2012.

* cited by examiner

LI-ION-COMPATIBLE FULLY-INTEGRATED HYBRID CONVERTER

PRIORITY CLAIM AND REFERENCE TO RELATED APPLICATION

The application claims priority under 35 U.S.C. § 119 and all applicable statutes and treaties from prior provisional application Ser. No. 62/830,661, which was filed Apr. 8, 2019, and is incorporated by reference herein.

FIELD

A field of the invention is DC-DC voltage conversion, particularly step-down conversion from a battery power source. Example applications of the invention include portable electronic devices, such as laptop computers, smart phones, internet-things-of-interest (IoT) and tablets.

BACKGROUND

Portable electronic devices, such as laptops computers, smart phones, IoTs and tablets, are powered by Lithium ion batteries. Typical Li-ion battery voltages on mobile devices are much greater than the operating voltages for the various chip components. Typical Li-Ion batteries have voltage ratings in the range of 2.8-4.2 volts. Modern processors and electronics included in portable electronic devices operate at about 1 volt or less, typically 0.6-1.0V. DC-to-DC power converters are employed to reduce the battery voltage to useable levels for different components around the chip. The required step-down of voltage should also maximize battery life.

DC-DC conversion is primarily performed today using either linear regulators, switched-inductor, or switched-capacitor converters. Linear regulators are small, yet inefficient when voltage conversion ratios are large. Switched-inductor converters can be very efficient but require large inductors that can limit the thinness of smartphones and other mobile platforms. Decreasing the size of the inductor would improve the form factor and cost of such devices. In conventional approaches, the DC-DC converter, typically implemented as a discrete power management integrated circuit (PMIC), is placed between the battery and the load.

To achieve high efficiency, PMICs tend to use inductive switching converter topologies, and to support the Li-ion voltage range, they are typically implemented in larger-geometry CMOS nodes (e.g., 180-350 nm). Both decisions yield larger than desired implementation area and board complexity. In place of an off-chip PMIC, integrating all DC-DC conversion functionality onto the load SoC itself can help minimize area and complexity, and the small on-chip passives enable high-frequency switching that enables fast transient voltage tracking and reduced voltage droop. However, there are two principal challenges that, taken together, have prevented prior-art from becoming a pragmatic replacement of discrete PMICs: 1) the quality of on-chip passives (i.e., inductors and high-density capacitors) is poor; and 2) the large Li-ion voltage range is not compatible with low-voltage transistors or high-density capacitors in scaled CMOS. To enable operation at Li-ion-compatible voltages in scaled CMOS, it is necessary to stack low-voltage transistors (or flying capacitors) such that each transistor (or capacitor) experiences only a fraction of the battery voltage across any of its terminals. Unfortunately, stacking devices incurs large conduction and switching losses, and increases driver complexity due to the need to integrate level shifters. In addition, the large series resistance and low inductance of on-chip inductors yield large conduction losses and thus requires higher-than-desired switching frequencies which incur high switching losses. While switched-capacitor (SC) converters can achieve higher on-chip efficiency, this occurs only at limited ratios of input-to-output voltages, with efficiency degrading significantly at large (i.e., Li-ion to SoC voltage) ratios.

Prior efforts include the following:

Bandyopadhyay et al., "20 uA to 100 mA DC-DC converter with 2.8-4.2 v battery supply for portable applications in 45 nm CMOS," IEEE Journal of Solid-State Circuits, vol. 46, no. 12, pp. 2807-2820, 2011.

Y. K. Ramadass, A. A. Fayed and A. P. Chandrakasan, "A Fully-Integrated Switched-Capacitor Step-Down DC-DC Converter With Digital Capacitance Modulation in 45 nm CMOS," JSSC, 2010.

R. Jain, et al., "A 0.45-1 V Fully-Integrated Distributed Switched-Capacitor DC-DC Converter with High-Density MIM Capacitor in 22 nm Tri-Gate CMOS," IEEE J. Solid-State Circuits, vol. 49, no. 4, pp. 917-927, 2014.

T. Breussegem and M. Steyaert, "Monolithic capacitive DC-DC converter with single boundary Multiphase control and voltage domain stacking in 90 nm CMOS," IEEE Journal of Solid-State Circuits, vol. 46, no. 7, pp. 1715-1727, 2011.

H. Le et al., "A sub-ns response fully integrated battery-connected switched-capacitor voltage regulator delivering 0.19 W/mm$^2$ at 73% efficiency," IEEE International Solid-State Circuits Conference, 2013.

S. Bang et al., "A Successive-Approximation Switched-Capacitor DC-DC Converter With Resolution of $V_{IN}/2^N$ for a Wide Range of Input and Output Voltages," IEEE Journal of Solid-State Circuits (Volume: 51, Issue: 2, February 2016).

P. Kumar et al., "A 0.4V~1V 0.2 A/mm$^2$ 70% efficient 500 MHz fully integrated digitally controlled 3-level buck voltage regulator with on-die high density MIM capacitor in 22 nm tri-gate CMOS," IEEE Custom Integrated Circuits Conference (CICC)}, 2015.

H. Krishnamurthy et al., "A 500 MHz, 68% efficient, fully on-die digitally controlled buck Voltage Regulator on 22 nm Tri-Gate CMOS," {IEEE Symposium on VLSI Circuits}, 2014.

J. Wibben and R. Harjani, "A High-Efficiency DC-DC Converter Using 2 nH Integrated Inductors," {IEEE Journal of Solid-State Circuits}, vol. 43, no. 4, pp. 844-854, April 2008.

M. Lee et al., "A 500-MHz, 0.76-W/mm Power Density and 76.2% Power Efficiency, Fully Integrated Digital Buck Converter in 65-nm CMOS," {IEEE Transactions on Industry Applications}, vol. 52, no. 4, pp. 3315-3323, 2016.

C. Huang and P. K. T. Mok, "An 82.4% efficiency package-bondwire based four-phase fully integrated buck converter with flying capacitor for area reduction," in Proc. IEEE Int. Solid-State Circuits Conf. (ISSCC'13), February 2013, pp. 362-363.

Monodeep Kar, Arvind Singh, Anand Rajan, Vivek De, Saibal Mukhopadhyay, "An All-Digital Fully Integrated Inductive Buck Regulator With A 250-MHz Multi-Sampled Compensator and a Lightweight Auto-Tuner in 130-nm CMOS," JSSC, 2017

Y. Ahn, H. Nam and J. Roh, "A 50-MHz Fully Integrated Low-Swing Buck Converter Using Packaging Inductors," in IEEE Transactions on Power Electronics, vol. 27, no. 10, pp. 4347-4356, October 2012.

G. Villar and E. Alarcón, "Monolithic integration of a 3-level DCM operated low-floating-capacitor buck converter for DC-DC step-down conversion in standard CMOS," in IEEE Power Electronics Specialist Conf. (PESC), 2008.

P. Kumar et al., "A 0.4V~1V 0.2 A/mm² 70% efficient 500 MHz fully integrated digitally controlled 3-level buck voltage regulator with on-die high density MIM capacitor in 22 nm tri-gate CMOS," CICC, 2015.

W. Godycki, B. Sun and A. Apsel, "Part-time resonant switching for light load efficiency improvement of a 3-level fully integrated buck converter," ESSCIRC 2014—40th European Solid State Circuits Conference (ESSCIRC), Venice Lido, 2014, pp. 163-166.

W. Kim et al., "A fully-integrated 3-Level DC-DC converter for nanosecond-scale DVFS," IEEE Journal of Solid-State Circuits, vol. 47, no. 1, pp. 206-219, 2012.

SUMMARY OF THE INVENTION

A preferred embodiment is a DC-DC converter that converts voltage from a battery source providing a voltage $V_{in}$ to a lower level. A four-level transistor stack selectively connects an input voltage and flying capacitor voltages to an output inductor. Stress reduction transistors limit the charging of the flying capacitors to $V_{in}/3$. The stress reduction transistors can also limit switching transistor voltages to $V_{in}/3$. Freewheel switches can be used to limit ringing in the output inductor.

BRIEF DESCRIPTION OF THE DRAWINGS

FIG. 2B shows the timing diagram of the power stage gate signals;

FIG. 3B shows the corresponding timing diagram of the power stage gate signals;

DETAILED DESCRIPTION OF THE PREFERRED EMBODIMENTS

Figures 1A, 1B, 1C, 1D:
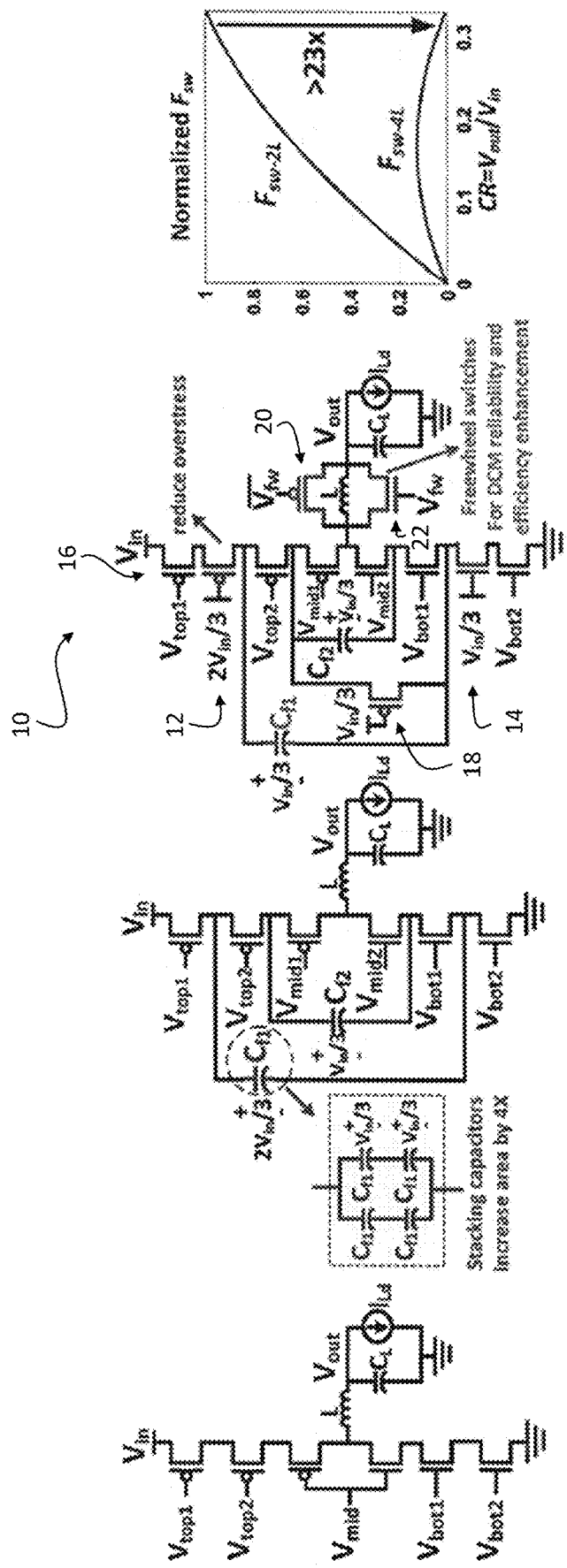
FIGS. 1A-1B (Prior Art) illustrate conventional 2-level and 4-level stacked buck converters.
FIG. 1C illustrates a preferred 4-level stacked buck converter with stress reduction transistors and a reduced implementation area.
FIG. 1D shows the normalized switching frequency versus the conversion ratio comparing two-level buck and the preferred four-level converter of FIG. 1C, operating in DCM with constant peak current.

Preferred embodiments provide a pragmatic solution for high efficiency fully integrated Li-ion-compatible (2.8V<Vin<4.5V) DC-DC conversion in scaled CMOS (≤28 nm CMOS technology), using standard transistors available in scaled technology, for powering wearable and IoT devices. A preferred embodiment uses only 1.5V transistors and capacitors, with an output inductor arranged as a modified 4-Level buck converter. The topology includes stress reduction transistors are added: two in series with the stack and one in parallel, which serve to reduce the stress on $C_{f1}$ to $V_{in}/3$, allowing reducing the $C_{f1}$ implementation area by 4× compared to a conventional 4-level buck converter that subjects $C_{f1}$ to $2V_{in}/3$. The overall achievable efficiency of the present converter is higher than the conventional 4-level buck converter, even when including the losses of the additional switches. An output inductor preferably includes freewheel switches, that turn ON only when the inductor current is zero so they do not contribute to conduction losses. Therefore, the freewheel switches are designed to be small relative to the main power stage switches, and hence their losses are negligible. Preferably, the freewheel switches are ~15× smaller than power stage switches.

Preferred embodiments provide a modified 4-level hybrid converter that achieves high efficiency with 1.5V transistors and on-chip flying passives by 1) stacking three 1.5V transistors to block voltages up to 4.5V when driving an inductor in a buck configuration; 2) connecting flying capacitors to the internal nodes of the transistor stack, thereby exploiting the existing internal nodes to convert the nominal buck converter into a four-level hybrid converter, which reduces the switching frequency by up to 23× for an up to 33% efficiency improvement; 3) soft-charging/discharging the capacitors through the inductor, thereby eliminating capacitor charge sharing losses (which tend to dominate the losses in SC converters); 4) modifying the 4-level switched-capacitor circuit with overstress-reducing transistors to reduce the voltage on the first flying capacitor and reducing its implementation area by 4×; 5) operating the converter in discontinuous conduction mode (DCM) to achieve high efficiency at low loads; 6) adding freewheel switches across the inductor to improve the efficiency and reliability in the zero current switching phase with negligible effect on losses; 7) exploiting the naturally switching voltages across the flying capacitors as power rails for the power stage drivers, eliminating the need for dedicated power rails, level shifters, or power-hungry pass transistors.

An example preferred embodiment that was fabricated provided a battery-connected DC-DC converter integrated in a scaled CMOS process. To achieve high efficiency while blocking the 2.8-4.2V Li-ion battery voltage range using only 1.5V transistors, a modified 4-level buck converter is utilized. Implemented in 28 nm FDSOI, the converter switches at up to 200 MHz, regulating down to 0.6-1.0V over a 10 uW-40 mW output power range via use of DCM-PFM control. The converter occupies 1.5 mm² of silicon area (including a pair of 5 nF flying capacitors and a 3 nH inductor) and achieves a peak efficiency of 78%. Such a preferred embodiment provides a novel circuit design to reduce the chip area requirements for a power management IC as used in Li-ion battery powered mobile devices, including phones, tablets and IOT applications.

Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale.

To understand advances and modifications of a preferred embodiment, conventional 2-level and 4-level stacked buck converters are respectively shown in FIGS. 1A and 1B. For the conventional (i.e., 2-level) buck converter of FIG. 1A, operating from a Li-ion-compatible $V_{in} \leq 4.2V$ were to be implemented using the 1.5V transistors available in a 28 nm process, it requires stacking at least three transistors to make up a power switch, $V_{top1}$, $V_{top2}$, $V_{mid}$, $V_{bot1}$, $V_{bot2}$. When operating in DCM (discontinuous conduction mode), the required switching frequency for the 2-level converter is: $F_{sw-2L}=2I_L V_{in}CR(1-CR)/(LI_{pk}^2)$, where $I_L$ is the load current, CR is the conversion ratio, and $I_{pk}$ is the peak inductor current. The low practically achievable on-chip inductor ESR and overall size (nH range) results in a very high switching frequency (100s of MHz), that causes high switching losses and efficiency degradation. For example, previously reported buck converters using on-chip inductors achieved efficiency improvements over an ideal LDO of only 2% in [H. Krishnamurthy et al., "A 500 MHz, 68% efficient, fully on-die digitally controlled buck Voltage Regulator on 22 nm Tri-Gate CMOS," {IEEE Symposium on VLSI Circuits}, 2014] and up to 204% in [J. Wibben and R. Harjani, "A High-Efficiency DC-DC Converter Using 2 nH Integrated Inductors," {IEEE Journal of Solid-State Circuits}, vol. 43, no. 4, pp. 844-854, April 2008], [M. Lee et al., "A 500-MHz, 0.76-W/mm Power Density and 76.2% Power Efficiency, Fully Integrated Digital Buck Converter in 65-nm CMOS," {IEEE Transactions on Industry Applications}, vol. 52, no. 4, pp. 3315-3323, 2016] by using magnetic coupling, all at substantially larger area than an LDO and, importantly, at low (i.e., non Li-ion-compatible) voltage conversion ratios. Such conventional 2-level buck topologies are therefore not well suited for fully-integrated battery-connection in scaled CMOS.

A conventional 4-level hybrid topology of FIG. 1B improves the 2-level of FIG. 1A. Given that the stacked transistors are necessary, it is advantageous to exploit the existing internal nodes of the nominally 2-level buck and convert it into a 4-level converter. The hybrid converter of FIG. 1B utilizes the high-density flying capacitors to effectively reduce the swing across the inductor from 0-to-$V_{in}$ to 0-to $V_{in}/3$. With reduced inductor voltage swing, the switching frequency of the 4-level buck is: $F_{sw-4L}=2I_L V_{in}CR(1-CR)/(LI_{pk}^2)$. Thus, the required switching frequency in DCM is reduced by up to 23× as shown in FIG. 1D, enabling correspondingly reduced switching losses for higher efficiency in a topology that inherently supports voltage blocking capabilities larger than those of the constituent switches alone. The FIG. 1B 4-level topology improves efficiency over the FIG. 1A 2-level buck and supports operation from a Li-ion battery using only 1.5V transistors. However, the flying capacitor $C_{f1}$ experiences a voltage of $2V_{in}/3$ across its terminals. If implemented using high-density 1.5V capacitors, $C_{f1}$ would thus require 4× the area of $C_{f2}$.

A preferred embodiment 4-level converter 10 in FIG. 1C reduces voltage stress on $C_{f1}$ and therefore eliminates an area penalty for $C_{f1}$ in FIG. 1B of 4×. Stress reduction transistors 12 and 14 are added in series (in series on top of the other power transistors) with a transistor stack 16 to ground, which also includes $V_{top1}$, $V_{top2}$, $V_{mid1}$, $V_{mid1'}$, $V_{bot1}$, $V_{bot2}$. Another stress reduction transistor 18 is added in parallel to the series combination of $V_{bot1}$, $V_{mid2}$, and $V_{mid1}$. The stress reduction transistors 12, 14 and 18 reduce the voltage across $C_{f1}$ to $V_{in}/3$. The position of stress reduction transistor 12 creates a voltage drop of $2V_{in}/3$, the position of transistor 18 sees a voltage drop of $V_{in}/3$, which serve to reduce the stress on $C_{f1}$ to $V_{in}/3$. Compared to FIG. 1B, the size of $C_{f1}$ can be reduced by 2×. Alternatively, if the same total area is used, then the FIG. 1C circuit 10 can utilize larger passives, the overall achievable efficiency is higher, even when including the losses caused by the additional transistor switches. In other words, instead of allocating area to a big $C_{f1}$, a preferred embodiment can use the saved area to allocate to a larger capacitance for $C_{f1}$ or $C_{f2}$, and/or use a larger inductor. In general, larger valued passives results in better efficiency—so it is beneficial to provide the largest passive values in the smallest area possible.

To reduce ringing in the inductor zero current switching phase, which may otherwise degrade efficiency or reliability, the circuit 10 includes freewheel switches 20, 22 across the inductor L. The freewheel switches 20, 22 turn ON only when the inductor current is zero, so they do not contribute to conduction losses. One of the switches 20, 22 is PMOS and one is an NMOS, which helps to improve conductance regardless of the voltage drop across the switches. The freewheel switches are preferably small relative to the main power stage switches, and hence their losses are negligible. Preferably, the freewheel switches 20, 22 are ~15× smaller than power stage switches. The present 4-level converter improves efficiency.

Large flying capacitors are preferred to reduce the hard-switching losses and improve efficiency. While in hybrid converters, $C_f$ is soft charged/discharged through the inductor, thus small flying capacitance is an option that can be used without sacrificing efficiency. However, the voltage ripple on $C_f$ can over-stress the power switches so $C_{f1}$ and $C_{f2}$ values are selected such that the voltage across the power switches does not exceed their voltage rating.

The maximum voltage across the power stage transistors $V_{max}$ equals to $V_{in}/3+\Delta V_c$. For $V_{in} \leq 4.2$, $V_{max} \leq 1.4+\Delta V_c$. Therefore, for 1.5-V transistors, the maximum allowed flying capacitor ripple $\Delta V_{max}$ is 100 mV (i.e., $\Delta V_c$). The value of the designed flying capacitor can then be computed using the following formula $$C_V \geq \frac{LI_{pk}^2}{2V_{in}\left(\frac{1}{3}-CR\right)\Delta V_{max}} \quad (1)$$

where $I_{pk}$ is the peak inductor current and CR is the conversion ratio (CR=$V_{out}/V_{in}$).

If a conventional two-level buck converter was to be implemented in 28 nm using the available 1.5-V transistor, at least three stacked transistors would be required to block 4.2 V, as shown in FIG. 1A. When operating in the discontinuous conduction mode (DCM), the switching frequency of the two-level buck is given by $$F_{SW-2L} = \frac{2I_{LD}V_{in}CR(1-CR)}{LI_{pk}^2} \quad (2)$$

where $I_{LD}$ is the load current, CR is the conversion ratio (CR=$V_{out}/V_{in}$), and $I_{pk}$ is the peak inductor current. As mentioned in Section I, the poor quality of on-chip inductor makes the two-Level buck not a suitable fully integrated battery-connected PMU in scaled CMOS. The large effective series resistance (ESR) results in high conduction losses and the small on-chip inductor increases the switching frequency to 100 s of MHz, increasing the switching losses and results in a poor efficiency.

The prior Four-Level converter of FIG. 1B is favorable with off-chip passives. Given that the stacked transistors are necessary, it is advantageous to exploit the existing internal nodes of the nominally two-level buck and add flying capacitors to convert the two-Level buck into a four-level converter, as shown in FIG. 1B. High-density flying capacitors are used to reduce the swing at the inductor terminal $V_x$ from $V_{in}$ to $V_{in}/3$. As a result, the switching frequency of the four-level converter operating in DCM is:

$$F_{SW-4L} = \begin{cases} \dfrac{2I_{LD}V_{in}CR\left(\dfrac{1}{3}-CR\right)}{LI_{pk}^2} & 0 < CR < \dfrac{1}{3} \\ \dfrac{2I_{LD}V_{in}\left(CR-\dfrac{1}{3}\right)\left(\dfrac{2}{3}-CR\right)}{LI_{pk}^2} & \dfrac{1}{3} < CR < \dfrac{2}{3} \\ \dfrac{2I_{LD}V_{in}\left(CR-\dfrac{2}{3}\right)(1-CR)}{LI_{pk}^2} & \dfrac{2}{3} < CR < 1 \end{cases} \quad (3)$$

FIG. 1D shows the normalized switching frequency versus the conversion ratio, for the two-level buck and the four-level converter, operating in DCM with constant peak current. For the same value of inductor, the four-level converter can reduce the switching frequency by >23×, which is translated into up to 33% improvement in the efficiency, making this topology a promising fully integrated battery-connected power management solution in a scaled technology.

The four-level converter has three different principal modes of operation to support an output voltage from 0 to $V_{in}$, and the designation of four-level comes from the fact that $V_x$ node takes four different values: 0, $V_{in}/3$, $2V_{in}/3$, and $V_{in}$. More specifically, $V_x$ switches between 0 and $V_{in}/3$ (mode 1) or $V_{in}/3$ and $2V_{in}/3$ (mode 2) or $2V_{in}/3$ and $V_{in}$ (mode 3), to enable output voltage range: $0<V_{out}<V_{in}/3$, $V_{in}/3<V_{out}<2V_{in}/3$, and $2V_{in}/3<V_{out}<V_{in}$, respectively. At the boundary of the operating modes (i.e., at CR=⅓, ⅔, and 1), the inductor current ripple is approaching 0 and the converter operates as an SC (switched capacitor) converter. Since the target output voltage of a fully integrated converter in scaled CMOS will typically range from 0.6 to 1.0 V when converting from a Li-ion battery that varies between 2.8 and 4.2 V, mode 1 is the primary mode of operation.

Figure 2A:
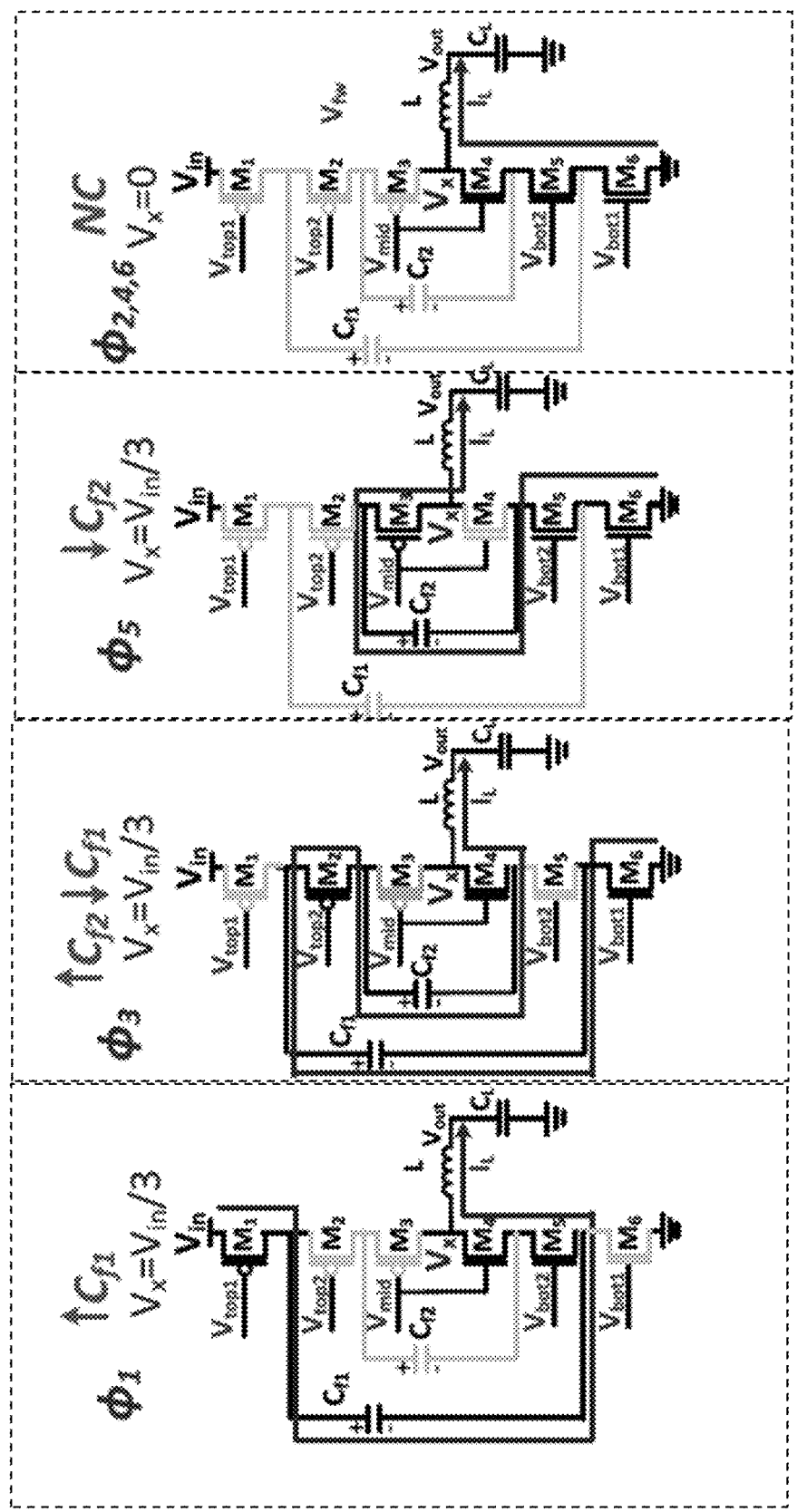
FIG. 2A shows the inductor current path in different switching phases for the preferred four-level converter of FIG. 1C.
Figure 2B:
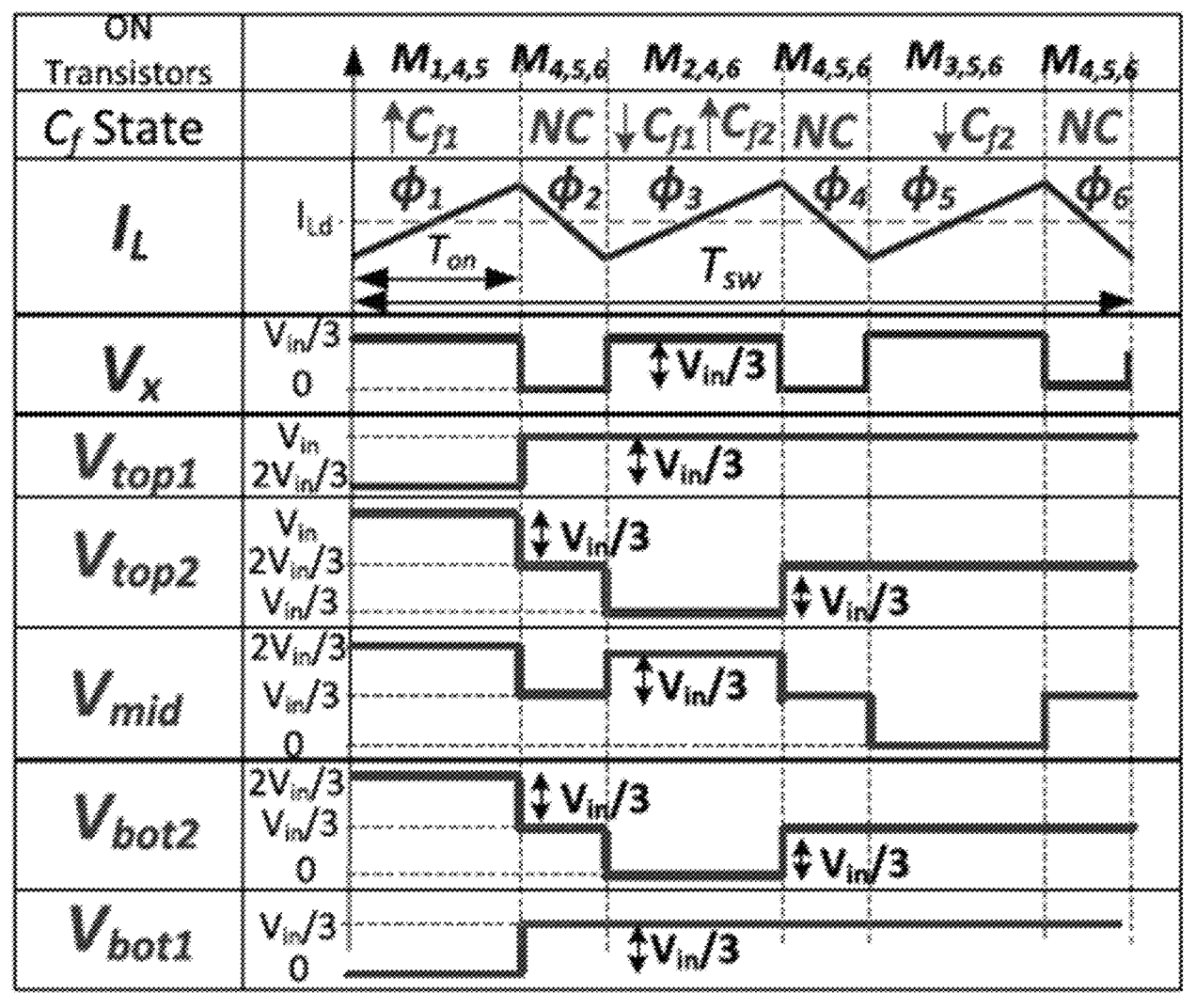

FIG. 2A shows the inductor current path in different switching phases for the four-level converter 10 of FIG. 1C operating in mode 1, along with the equivalent voltage at $V_x$ and the state of the flying capacitors. The timing diagram of the power stage gate signals are shown in FIG. 2B. The gate-to-source $V_{gs}$ gate-to-drain $V_{gd}$ and drain-to-source $V_{ds}$ voltages of each power stage transistor in each phase never exceed $V_{in}/3$. Thus, no transistor exceeds its maximum voltage rating, even at the highest compatible $V_{in}$. In each switching phase, the flying capacitors $C_{f1}$ and $C_{f2}$ are either charging, discharging, or not connected (NC), such that, the capacitors charge is balanced at the end of $\Phi_6$. The inductor switching phases of the four-level converter operating in mode 1 can be described as follows.

Phase $\Phi_1$: $M_1$, $M_4$ and $M_5$ are turned on, while $C_{f1}$ is charged and $C_{f2}$ is NC.
The voltage on $V_x$ node can be described as $V_x=V_{in}-V_{f1}$.
Phase $\Phi_{2,4,6}$: $M_4$, $M_5$ and $M_6$ are turned on, while $C_{f1}$ is charged and $C_{f2}$ is NC. $V_x=0$.
Phase $\Phi_3$: $M_2$, $M_4$ and $M_6$ are turned on, while $C_{f1}$ is discharged and $C_{f2}$ is charged. The voltage on $V_x$ node can be described as $V_x=V_{f1}-V_{f2}$.

Phase $\Phi_5$: $M_3$, $M_5$ and $M_6$ are turned on, while $C_{f1}$ is NC and $C_{f2}$ is discharged. The voltage on $V_x$ node can be described as $V_x=V_{f2}$.
In the steady state, $V_{f1}=2V_{in}/3$, $V_{f2}=V_{in}/3$, and $V_x$ equals 0 in $\Phi_{2,4,6}$ and $V_{in}/3$ in $\Phi_{1,3,5}$.

The present converter 10 in FIG. 1C is particularly favorable for fully-integrated converter with on-chip passives. While the four-level topology of FIG. 1B improves the efficiency over the two-level buck of FIG. 1A, and supports operation from a Li-ion battery without additional power switches, the steady-state voltage across the flying capacitor $C_{f1}$ equals $2V_{in}/3$. If implemented using the available high-density 1.4-V capacitors, capacitor stacking of $C_{f1}$ is required, resulting in a flying capacitor that is 4× the implementation area of $C_{f2}$ for the same amount of capacitance.

To reduce the voltage stress on $C_{f1}$ and eliminate its area penalty, the switching states of the flying capacitors in the converter 10 of FIG. 1C are modified to reduce the voltage stress on $C_{f1}$ from $2V_{in}/3$ to $V_{in}/3$, thereby reducing the $C_{f1}$ implementation area by 4×. As discussed above, the stress reduction transistors 12, 14 and 18 reduce the voltage across $C_{f1}$ to $V_{in}/3$. The larger passives that can then be used can achieve up to 12% higher overall efficiency, even when including the losses of the additional power switches.

The preferred converter 10 operates in DCM to achieve high efficiency over low output current ranges appropriate for IoT applications. If the inductor was left floating during the zero-switching phase, large ringing may present itself at the $V_x$ node, potentially over-stressing the power switches. The freewheel switches 20, 22 reduce ringing and turn on only when the inductor current is nearly zero, so they do not contribute to conduction losses. With this operation and their relatively small size, the freewheel switches 20, 22 have a negligible effect on the overall achievable efficiency.

Figure 3A:
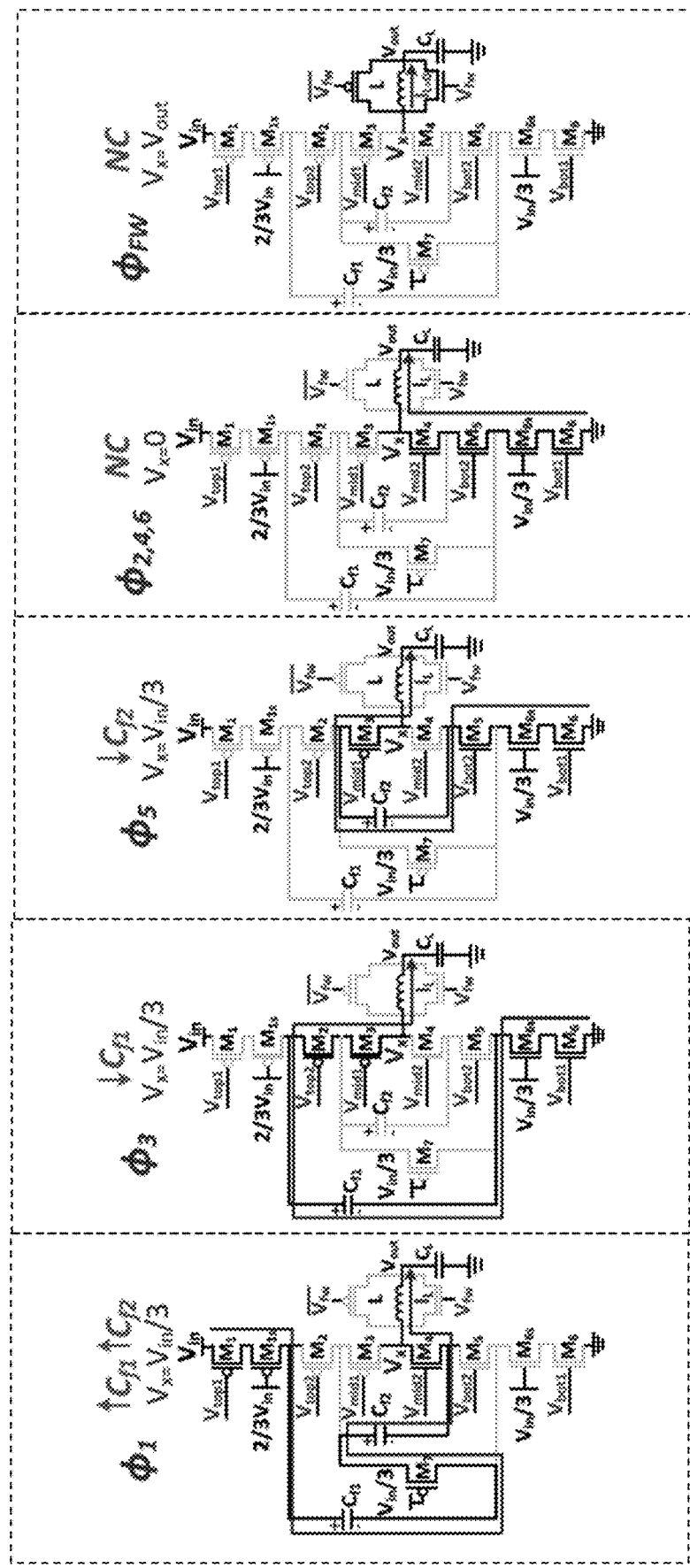
FIG. 3A shows the power stage inductor current path for the preferred four-level converter of FIG. 1C along with the flying capacitors' state, and the $V_x$ node voltage.
Figure 3B:
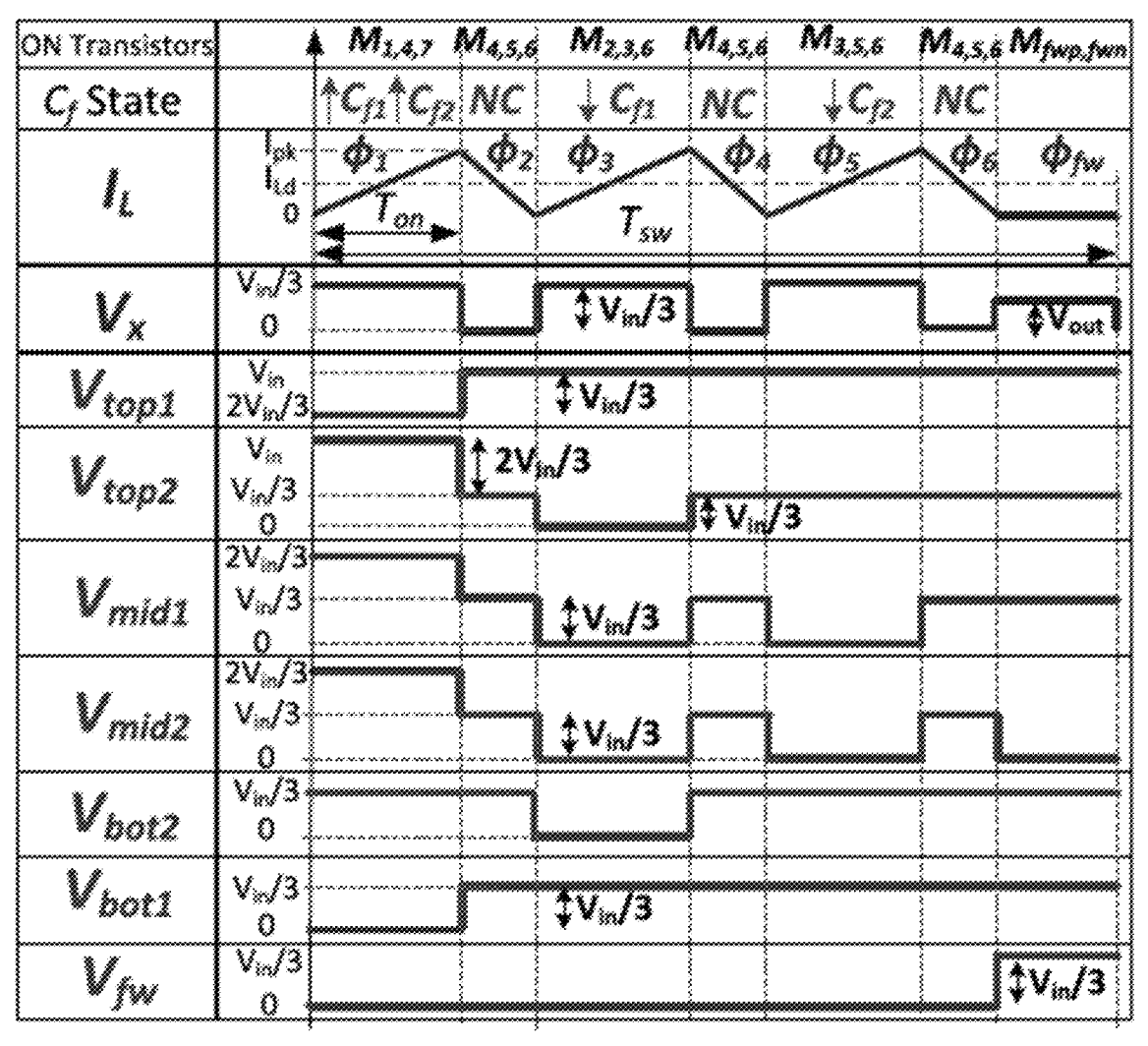

FIG. 3A shows the power stage inductor current path for the converter 10 along with the flying capacitors' state, and the $V_x$ node voltage. FIG. 3B shows the corresponding timing diagram of the power stage gate signals. The gate voltage of the power stage transistors in each phase is set such that $V_{gs}$, $V_{gd}$, and $V_{ds}$ for each transistor do not exceed the maximum voltage of $V_{in}/3$. In each switching phase, flying capacitors $C_{f1}$ and $C_{f2}$ are either charging, discharging, or NC, such that the capacitor's charges are balanced at the end of $\Phi_6$. The inductor switching phases of the four-level converter operating in mode 1 can be described as follows.

Phase $\Phi_1$: $M_1$, $M_{1s}$, $M_4$ and $M_7$ are turned on, while $C_{f1}$ is and $C_{f2}$ are charging. The voltage on $V_x$ node can be described as $V_x=V_{in}-V_{f1}-V_{f2}$.
Phase $\Phi_{2,4,6}$: $M_4$, $M_5$, $M_{6s}$ and $M_6$ are turned on, while $C_{f1}$ and $C_{f2}$ are NC. $V_x=0$.
Phase $\Phi_3$: $M_2$, $M_3$, $M_{6s}$ and $M_6$ are turned on, while $C_{f1}$ is discharged and $C_{f2}$ is charged. The voltage on $V_x$ node can be described as $V_x=V_{f1}$.
Phase $\Phi_5$: $M_3$, $M_5$, $M_{6s}$ and $M_6$ are turned on, while $C_{f1}$ is NC and $C_{f2}$ is discharged. The voltage on $V_x$ node can be described as $V_x=V_{f2}$
Phase $\Phi_{FW}$: $M_{fwn}$ and $M_{fwp}$ are turned on and the inductor terminals are shorted to $V_{out}$ to avoid ringing in this phase.
In the steady state, $V_{f1}=V_{in}/3$, $V_{f2}=V_{in}/3$, and $V_x$ equals 0 in $\Phi_{2,4,6}$ and $V_{in}/3$ in $\Phi_{1,3,5}$ and $V_{out}$ in $\Phi_{FW}$. The converter 10 therefore provides much better performance with on-chip passives.

Figure 4A:
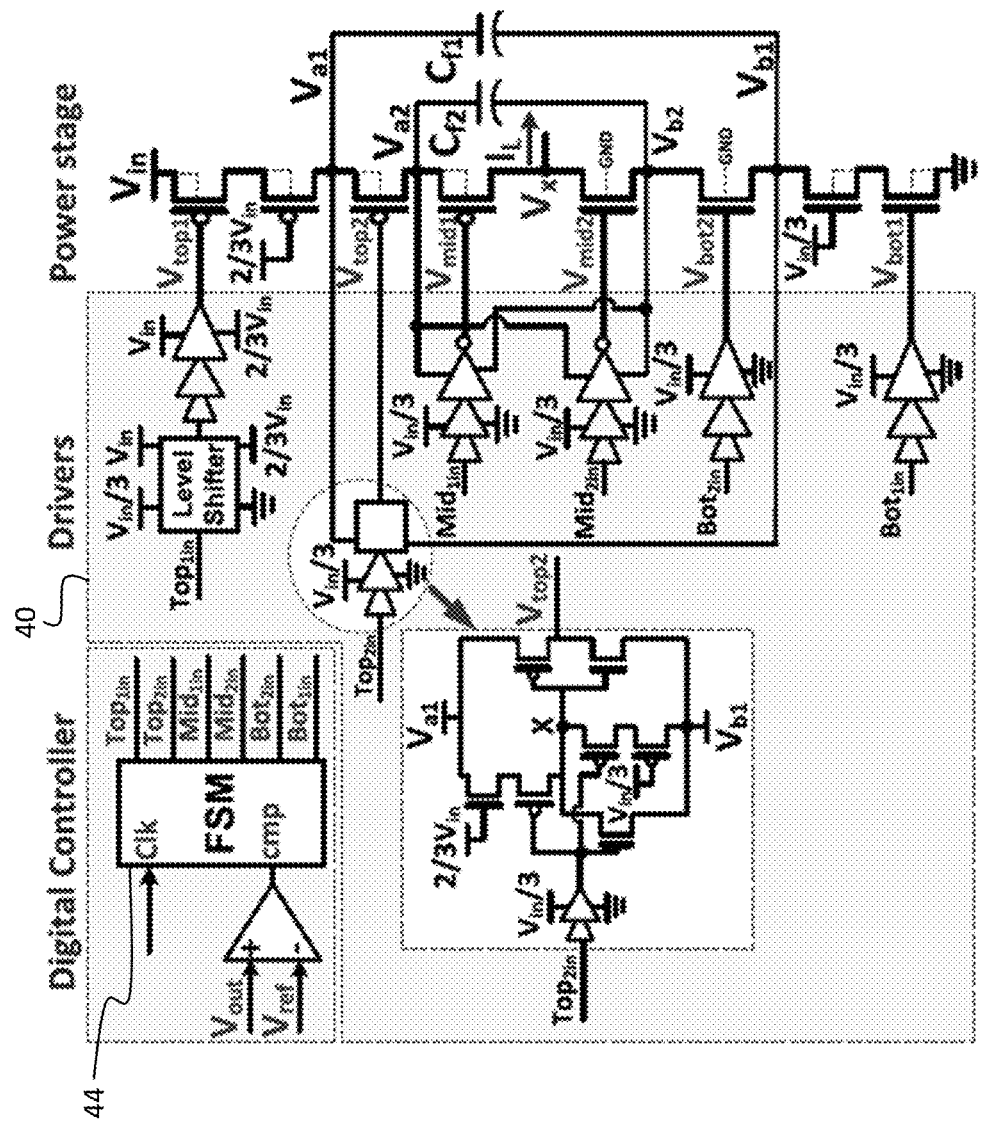
FIG. 4A illustrates preferred driver circuits for the preferred four-level converter of FIG. 1C and FIG. 4B the waveforms of the preferred driver circuits.

The converter 10 of FIG. 1C needs to be driven with three-level gate signals, i.e., the signals shown in FIG. 3B, to ensure that no transistor exceeds the maximum rating of 1.5 V (i.e., $V_{in}/3$). FIG. 4A illustrates preferred drivers 40 and FIG. 4B their corresponding waveforms. Signals $V_{bot1}$ and $V_{bot2}$ switch between GND and $V_{in}/3$ and can use a conventional two-transistor inverter-based CMOS driver. Signals $V_{Mid1}$ and $V_{Mid2}$ are three-level gate signals which must switch between GND, $Vi_n/3$, and $2V_{in}/3$. Similarly, signal $V_{Top2}$ must switch between GND, $V_{in}/3$, and $V_{in}$.

Timing between power stage gate signals is important for reliable operation. Non-overlap circuits are preferably added to ensure none of the transistors are overstressed during transitions. For example, a non-overlap circuit is added between $Top_{1in}$ and $Bot_{1in}$ to avoid shorting $C_{f1}$ between $V_{in}$ and GND during transitions. Also, a non-overlap circuit (not illustrated in FIG. 4A) is preferably added between $Top_{2in}$ and $Bot_{2in}$ to avoid shorting $C_{f1}$ to $C_{f2}$ during transitions.

When switching from $\Phi_1$ to $\Phi_2$, if $Mid_{1in}/Mid_{2in}$ signal switches from $V_{in}/3$ to GND before $V_{a2}$ and $V_{b2}$ switch from $2V_{in}/3$ and $V_{in}/3$ to $V_{in}/3$ and GND, $V_{Mid1}/V_{Mid2}$ transistors will be overstressed. To ensure that this does not occur, the non-overlap circuit 42 delays the negative edge of $Mid_{1in}$ and $Mid_{2in}$ signals with respect to the rising edge of $Top_{1in}/Bot_{1in}$. This ensures that $Mid_{1in}/Mid_{2in}$ will not switch to GND while $V_{a2}$ still equals $2V_{in}/3$.

Rather than creating new, dedicated power rails for the sole purpose of driving the power transistors, the drivers 40 of FIG. 4A exploit the existing switching terminals of the flying capacitors as dynamic power/ground rails. This eliminates the need for complex power-hungry stacked drivers with dedicated power rails, while simultaneously eliminating the need for many level shifters. Specifically, the positive terminal of $C_{f2}$ ($V_{a2}$) and the negative terminal of $C_{f2}$ ($V_{b2}$) are used as power and ground of the two middle switch drivers, respectively. The positive terminal of $C_{f1}$ ($V_{a1}$) and the negative terminal of $C_{f1}$ ($V_{b1}$) are used as power and ground of the $V_{Top2}$ driver, respectively. Since the voltage across the flying capacitors equals $V_{in}/3$, stacked drivers are not required, and conventional two-transistor inverter-based CMOS drivers can be utilized. The driver generating $V_{Top2}$ uses mixed stacked transistors in the first stage to do level shifting in $\Phi 1$ only using the flying capacitor terminals voltage. On the other hand, the top switch gate signal $V_{Top1}$ switches between $2V_{in}/3$ and $V_{in}$, and thus requires a level shifter to shift up the input signal switching between GND and $V_{in}/3$ to a signal switching between $2V_{in}/3$ and $V_i$. A finite state machine 44 provides signals to the drivers 40.

Figure 4B:
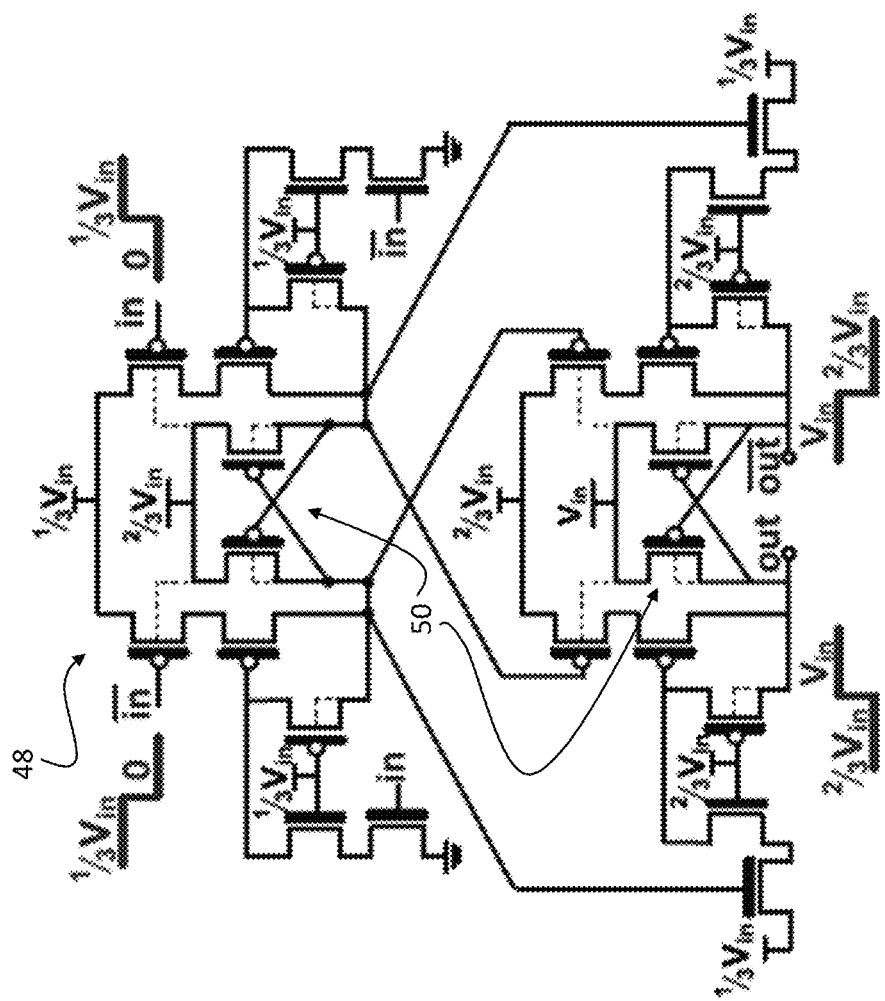
FIG. 4C is a waveform that illustrates operation of the finite-state machine FSM of FIG. 4A.

The top switch gate signal $V_{Top1}$ requires a level shifter to convert an output signal from the finite-state machine (FSM) 44 switching between GND and $V_{in}/3$ up to signal switching between $2V_{in}/3$ and $V_{in}$. FIG. 4B shows a preferred level shifter 48 for this operation. The level shifter 48 is all digital and ensures that no transistor exceeds the maximum voltage of $V_{in}/3$. FDSOI (Fully depleted silicon-on-insulator) body biasing is preferred to improve performance by reducing the threshold voltage when turned on and reducing leakage when turned off. The low input voltage is shifted-up by the positive feedback action of cross-coupled transistors 50 in the level shifter 48 on both the input and output sides. Connecting the body of the cross-coupled transistors to their drains instead of their sources reduces the strength of the pMOS latch, and hence enables fast transitions and reduces the level-shifter delay. Connecting the body of the top MOSFETS transistors (indicated with dotted lines) to a high voltage reduces the leakage power consumption. Simulations show that the delay of the level shifter 48 is only 230 ps with the total power of 1.27 nW at a switching frequency of 1 kHz.

Figure 4C:
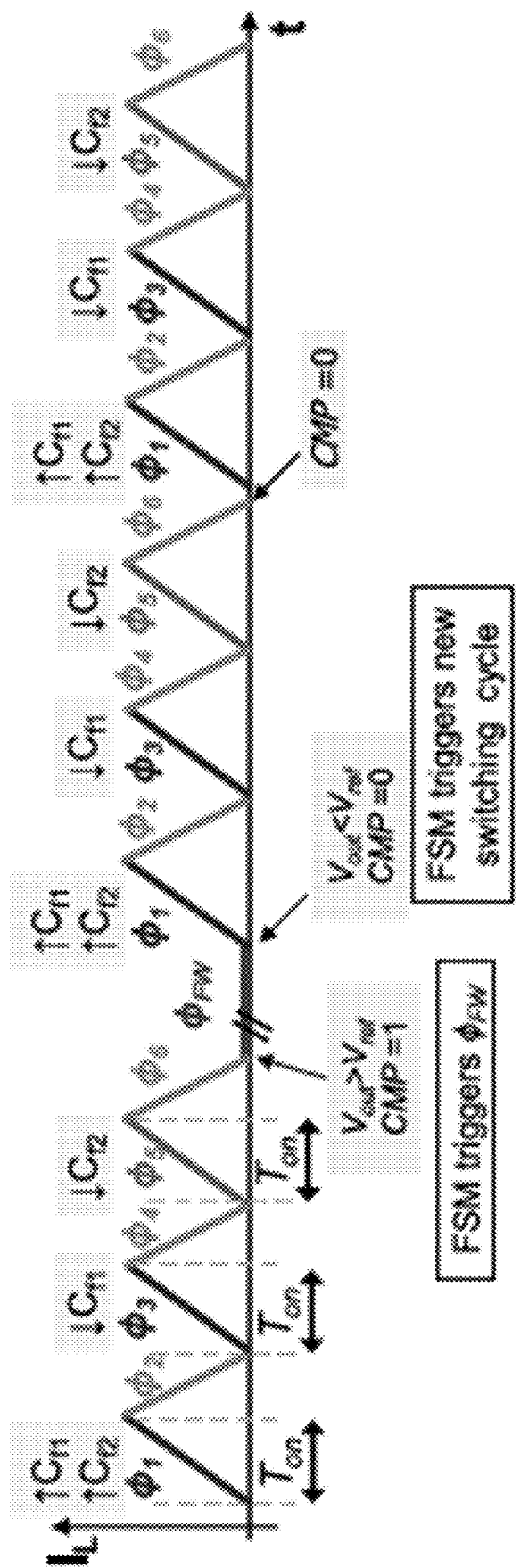

The FSM 44 regulates output of the converter 10, and operation of the FSM 44 is illustrated in the waveform of FIG. 4C. The FSM 44 checks a comparator output that compares $V_{out}$ to $V_{ref}$ every six inductor switching phases. At the end of $\Phi_6$, if the load did not receive sufficient energy (i.e., $V_{out}$ is below the reference voltage $V_{ref}$), the comparator output is low, and the FSM 44 triggers new six inductor switching phases. If the load has sufficient energy ($V_{out} > V_{ref}$), the comparator output is high, and the converter goes to the freewheel phase $\Phi_{FW}$. During the freewheel phase $\Phi_{FW}$, if $V_{out}$ goes below $V_{ref}$, the comparator output goes low and the FSM 44 triggers new six inductor switching phases.

The FSM 44 checks the comparator output and acts only at the end of $\Phi_6$ for two reasons. First, to not interrupt the charge balance of the flying capacitors. Second, if the FSM 44 checks the comparator's output at end of $\Phi_2$, $\Phi_4$, and $\Phi_6$, and accordingly switches to $\Phi_{FW}$ between, this will result in an effective switching frequency increase in 3×, resulting in more losses and efficiency degradation.

Despite the fact that DCM is favorable mode for low-power applications, DCM operation limits the maximum output power of the converter 10 (and thus the power density), which is determined by the inductor peak current. In DCM operation, the inductor peak current must be at least double the load current (i.e., $I_{pk} \geq 2I_{Ld}$). Therefore, the current capability of the converter, operating in DCM is determined by its maximum $I_{pk}$. Designing a converter to operating DCM with a large $I_{pk}$ can increase the converter current capability and reduces the converter switching frequency as well, and hence, improves the efficiency. However, in hybrid topologies, $I_{pk}$ is limited by the inductor value, the inductor series resistance, the maximum inductor charging time ($T_{ON}$), and the resistance of the employed switches. The inductor ON-time $T_{ON}$ should be less than the inductor resonance time $T_r$ where $T_r$ is defined as:

$$T_r = 2\pi\sqrt{LC_{tot}} \qquad (4)$$

Where $LC_{tot} = C_{f1}//C_{f2}//C_L$. Hence, as the converter passives increase, $T_{ON}$ and $I_{pk}$ can be increased, and thus, the converter current capability and efficiency will increase accordingly. However, there are area limitations for fully integrated converters, so for a converter to achieve maximum power (i.e., power density) using the same passives value, the converter can be switched to operate in CCM (continuous conduction mode) at high load current. It can be shown that the present converter 10 can be operated in CCM mode to support higher power densities. For example, the FSM 44 can can operate the switches such that the inductor current does not reach zero at any point in a steady-state waveform. This is used for large load currents only.

Figure 5:
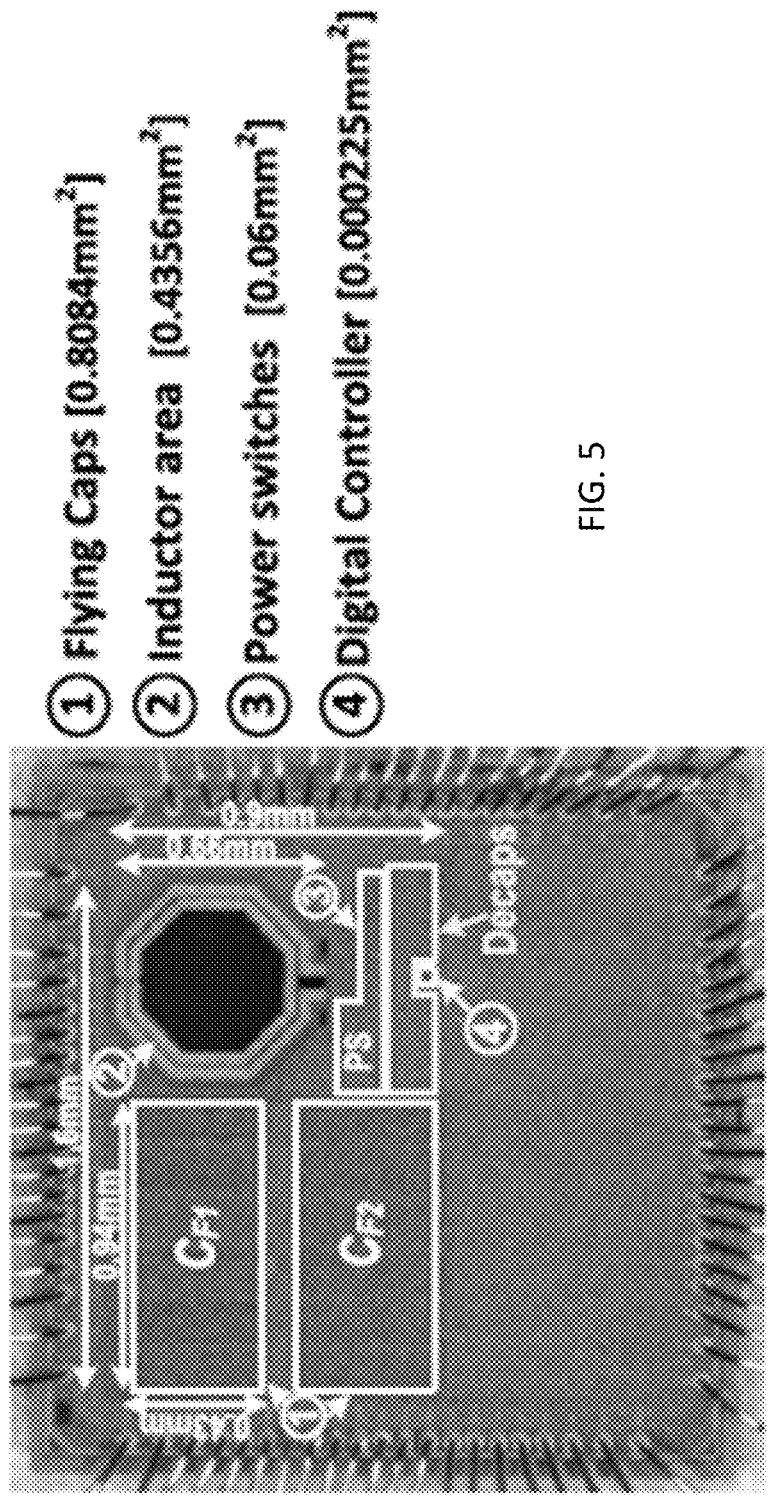
FIG. 5 is a micrograph of an experimental fabricated converter according to FIG. 1C, with all passives integrated on chip in 28 mm FDSOI.

FIG. 5 is a micrograph of an experimental fabricated converter according to FIG. 1C, with all passives integrated on chip in 28 mm FDSOI. All of the converter 10 including the flying capacitors $C_{f1}$ and $C_{f2}$, the inductor, the drivers (cascaded inverters) the controller and the converters power switches were integrated in a signal chip. The experimental fabricated converter of the invention showed that a preferred embodiment of the invention provides a fully integrated dc-dc converter compatible with Li-ion battery voltage (2.8-4.2 V), in scaled CMOS (28 nm), using only the available low-voltage transistors (1.5 V) and on-chip passives. Operating in DCM, the converter achieved high efficiency over load range of 4000×(10 µW–40 mW) appropriate for IoT applications. The present converter architecture utilizes the switching terminals of the flying capacitors as dynamic power/GND rails for the power stage drivers to eliminate the need for complex power-hungry stacked drivers with dedicated power rails and level shifters.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A DC-DC converter for converting voltage from a battery source providing a voltage $V_{in}$, the converter comprising: integrated capacitors and transistors arranged as a hybrid 4-level buck converter with 4-level transistor stack having a pair of flying capacitors $C_{f1}$ and $C_{f2}$ connected thereto, an output inductor connected to a center of the 4-level transistor stack, a pair of series stress reduction transistors, one being between two of the transistors in the 4-level transistor stack and the other being between ground and the 4-level transistor stack, and a parallel stress reduction transistor in parallel with at least a portion of the 4-level transistor stack, wherein the series and parallel stress reduction transistors are arranged to limit voltage on each of the flying capacitors to $V_{in}/3$.

2. The DC-DC converter of claim 1, further comprising freewheel switches in parallel with the output inductor.

3. The DC-DC converter of claim 2, wherein the freewheel switches are sized to turn ON only when current in the output inductor is zero.

4. The DC-DC converter of claim 2, wherein the flying capacitors $C_{f1}$ and $C_{f2}$ and the output inductor are connected to internal nodes of the 4-level transistor stack.

5. The DC-DC converter of claim 2, comprising drivers to drive the 4-level transistor stack, wherein the flying capacitors $C_{f1}$ and $C_{f2}$ are arranged to serve as power rails for the drivers.

6. The DC-DC converter of claim 1, wherein the 4-level transistor stack and the stress reduction transistors consist of 1.5V transistors, and the converter can block a 2.8-4.2V Li-ion battery voltage range.

7. The DC-DC converter of claim 1, wherein the flying capacitors $C_{f1}$ and $C_{f2}$ are sized according to:

$$C_v \geq \frac{LI_{pk}^2}{2V_{in}\left(\frac{1}{3} - CR\right)\Delta V_{max}}$$

where $I_{pk}$ is the peak inductor current, CR is the conversion ratio (CR=$V_{out}/V_{in}$), and $\Delta V_{max}$ is a maximum allowed flying capacitor ripple.

8. The DC-DC converter of claim 1, wherein $\Delta V_{max}$ is ≤100 mV.

9. The DC-DC converter of claim 1, wherein all transistors and passives are sized such that gate-to-source $V_{gs}$ gate-to-drain $V_{gd}$ and drain-to-source $V_{ds}$ voltages of each transistor in the 4-level transistor stack never exceed $V_{in}/3$ during charging, discharging, or not connected (NC) operation so that capacitor charges are balanced after a switching cycle.

10. The DC-DC converter of claim 9, comprising a controller and driver that insure $C_{f1}$ and $C_{f2}$ are not shorted during switching transitions.

11. The DC-DC converter of claim 1, wherein a positive terminal of $C_{f2}$ and a negative terminal of $C_{f2}$ ($V_{b2}$) are used as power and ground of drivers that drive middle switches of the 4-level transistor stack.

12. The DC-DC converter of claim 1, wherein all transistors in the converter are fully depleted silicon-on-insulator body biased transistors.

13. The DC-DC converter of claim 1, comprising:
a finite state machine that provides signals switching between GND and $V_{in}/3$ for driving the transistors in the 4-level transistor stack based upon a difference between an output voltage of the converter and a reference voltage;
drivers receiving a signal from the finite state machine and driving transistors in the 4-level transistor stack; and
a level shifter for raising the signals of the finite state aching to signals that switch between $2V_{in}/3$ and $V_{in}$.

14. The DC-DC converter of claim 12, wherein the battery source is a lithium ion battery.

15. The DC-DC converter of claim 1, comprising drivers for driving transistors in the 4-level transistor stack, wherein the drivers provide three-level gate signals to middle transistors of the 4-level transistor stack, and wherein the drivers switch between GND, $Vi_n/3$, and $2V_{in}/3$.

16. The DC-DC converter of claim 15, wherein the drivers have circuitry to delay negative edges of the switching of the middle transistors in the 4-level transistor stack with respect to rising edges of top and bottom transistors in the 4-level transistor stack.

17. A DC-DC converter for converting voltage from a battery source providing a voltage $V_{in}$, the converter comprising:
switching means for selectively connecting an input voltage and flying capacitor voltages to an output inductor;
stress reduction means for limiting the charging of the flying capacitors to $V_{in}/3$.

18. The DC-DC converter of claim 17, further comprising ringing reduction means for reducing ringing in the output inductor.

19. The DC-DC converter of claim 17, comprising means for driving the switching means to limit transistors charging the flying capacitors to $V_{in}/3$.

20. The DC-DC converter of claim 17, wherein the stress reduction means limits voltages across transistors of the switching means to $V_{in}/3$.

\* \* \* \* \*